United States Patent [19]

Ciccio et al.

[11] 4,225,900
[45] Sep. 30, 1980

[54] INTEGRATED CIRCUIT DEVICE PACKAGE INTERCONNECT MEANS

[75] Inventors: Joseph A. Ciccio, Winchester; Rudolf E. Thun, Carlisle; Harry J. Fardy, Chelmsford, all of Mass.

[73] Assignee: Raytheon Company, Lexington, Mass.

[21] Appl. No.: 954,513

[22] Filed: Oct. 25, 1978

[51] Int. Cl.³ ............................................. H05K 1/08
[52] U.S. Cl. .................................. 361/395; 361/403; 361/410; 361/414; 357/80; 339/17 M; 339/18 C
[58] Field of Search .............. 357/74, 80; 339/17 LM, 339/17 M, 18 C; 361/395, 400, 403–406, 408, 410, 412, 414, 415, 417, 418

[56] References Cited
U.S. PATENT DOCUMENTS

| T955,008 | 2/1977 | Gregor | 361/400 |
|---|---|---|---|
| 3,403,300 | 9/1968 | Horowitz | 361/414 |
| 3,646,246 | 2/1972 | Olney, Jr. | 174/68.5 |
| 3,904,934 | 9/1975 | Martin | 361/412 |

Primary Examiner—Gerald P. Tolin
Attorney, Agent, or Firm—Richard M. Sharkansky; Joseph D. Pannone

[57] ABSTRACT

An integrated circuit device package is disclosed wherein a pair of dielectric support structures are provided, each one having a pattern of electrical conductors for interconnecting integrated circuit devices disposed thereon. The electrical conductors have end portions terminating into a plurality of contact pads disposed on a first surface of the support structures. A first one of the pair of support structures has corresponding contact pads on a second, opposite surface of the support structure, each one of the contact pads on the first surface being electrically connected to a corresponding one of the contact pads on the second surface. A dielectric spacer having a plurality of electrical contact pins is disposed between the pair of support structures. One end of each pin is electrically connected to a corresponding one of the contact pads disposed on the second surface of the first one of such structures, and the other end of such contact pin is electrically connected to a corresponding one of the contact pins disposed on the first surface of the second one of the structures. The contact pins are relatively short and thereby provide a relatively short electrical interconnect for the integrated circuit devices, thereby reducing parasitic capacitances normally associated with electrical interconnects.

5 Claims, 5 Drawing Figures

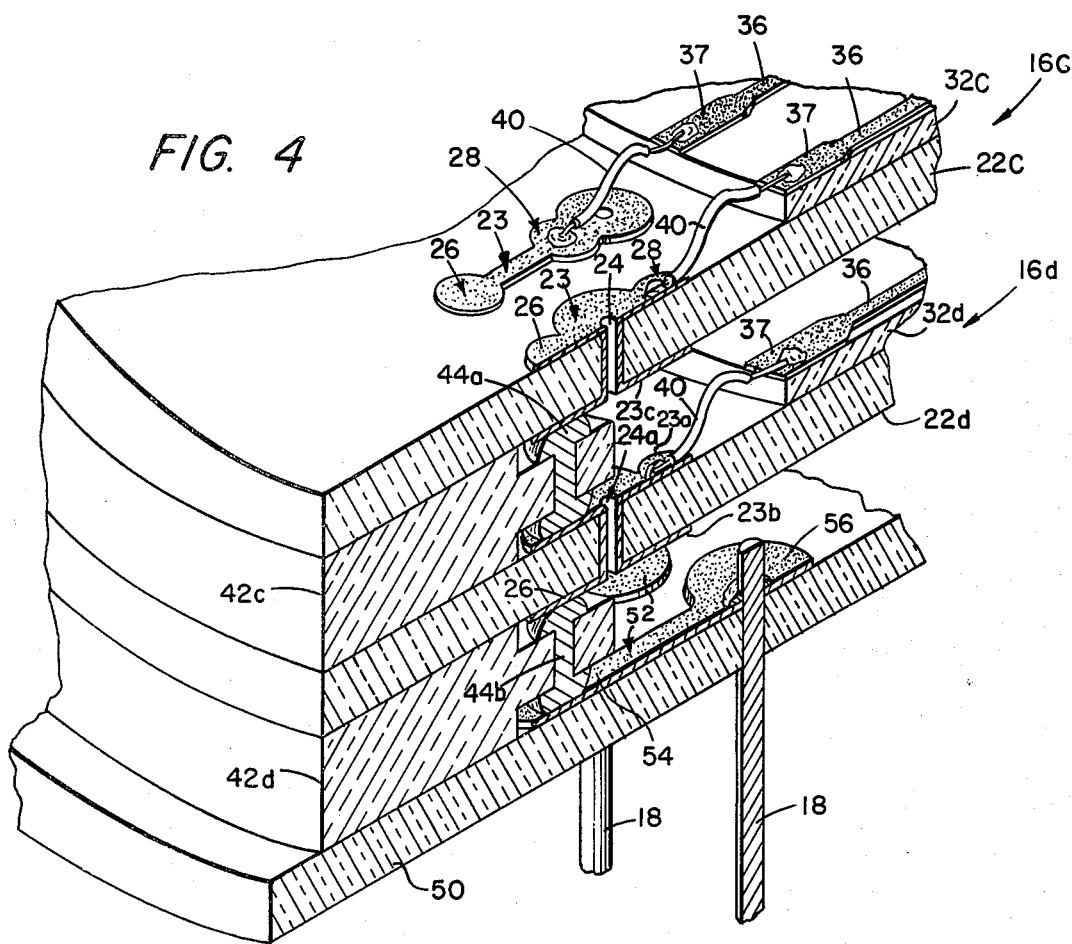
FIG. 4
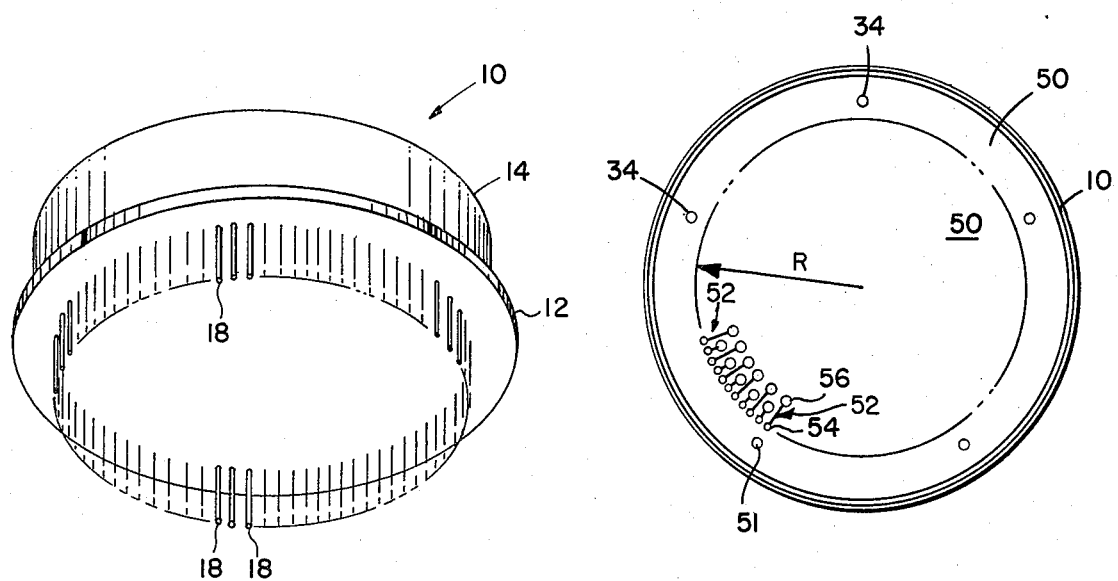
FIG. 2
FIG. 5

INTEGRATED CIRCUIT DEVICE PACKAGE INTERCONNECT MEANS

BACKGROUND OF THE INVENTION

This invention relates generally to packages for housing integrated circuit devices and, more particularly, packages for housing very large integration (VLSI) circuit devices.

As is known in the art, in many applications monolithic integrated circuits are packaged in so-called "flatpacks" or "DIPS" (dual in-line packages) which are mounted on, and electrically interconnected by, a printed circuit board. The printed circuit boards are electrically interconnected by a back panel into which the printed circuit boards are plugged. The back panel is generally either of printed circuit construction or constructed to enable the desired electrical interconnections between the printed circuit boards by individual wires.

While these packaging concepts have been found useful in many applications, it is, however, characterized by relatively large parasitic capacitances resulting from relatively long interconnect wires used to interconnect the printed circuit boards. These parasitic capacitances may be sufficiently large to adversely affect their use in many low power, high density integrated circuits such as complementary metal-oxide-semiconductor (CMOS)/silicon on sapphire (SOS) circuits, short channel NMOS circuits and I$^2$L circuits which operate with relatively small input signal voltage swings and which, due to their relatively high output impedances, will be slowed down when forced to operate with parasitic capacitances normally associated with printed circuit board and individual wire back panel interconnects.

SUMMARY OF THE INVENTION

In accordance with the present invention, a pair of dielectric support structures, each one having a pattern of electrical conductors with end portions terminating into a plurality of contact pads disposed on a first surface of such support structures, is provided. A first one of the pair of support structures has corresponding contact pads on a second, opposite, surface, each one of the contact pads on the first surface being electrically connected to a corresponding one of the contact pads on the second surface. A dielectric spacer having a plurality of electrically insulated contact pins passing through it is disposed between the pair of dielectric support structures. One end of each contact pin is electrically connected to a corresponding one of the contact pads disposed on the second surface of the first one of the dielectric support structures, and the other end of such contact pin is electrically connected with a corresponding one of the contact pins disposed on the first surface of the second one of such dielectric support structures. The contact pins are relatively short and thereby provide a relatively short electrical interconnect for the patterns of conductors, thereby reducing the parasitic capacitance normally associated with such electrical interconnects.

In a preferred embodiment of the invention, a plurality of dielectric support structures is enclosed in a package. Pins which are electrically connected to the patterns of conductors and which pass through the package enable such package to be electrically connected to external circuitry.

BRIEF DESCRIPTION OF THE DRAWINGS

The foregoing and other features of the invention, as well as the invention itself, may be more fully understood from the following detailed description read together with the accompanying drawings, in which:

FIG. 2 is a drawing showing the exterior of the package shown in FIG. 1;

FIG. 4 is an isometric drawing partially broken away and partially in section, showing the electrical interconnection between patterns of conductors disposed on a pair of dielectric support structures and electrical interconnections to pins which enable electrical interconnection to electrical circuitry external to the package shown in FIGS. 1 and 2; and FIG. 5 shows a plane view of the interior of the base of the package of FIG. 1 with an interconnect board on such base.

DESCRIPTION OF THE PREFERRED EMBODIMENTS

Figure 1:
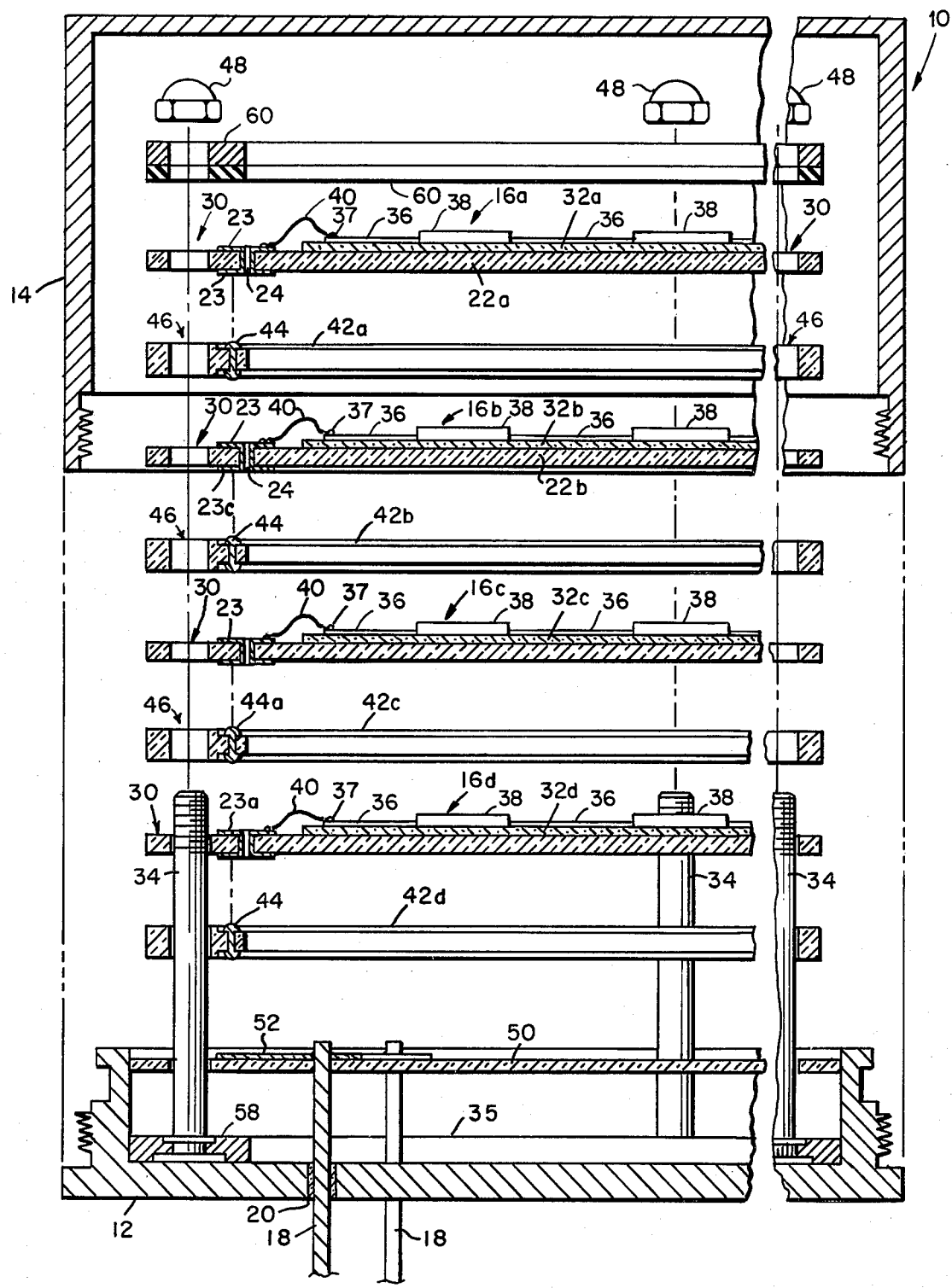
FIG. 1 is a cross-sectional exploded view, somewhat distorted, of a package for housing integrated circuit devices according to the invention.

Referring now to FIGS. 1 and 2, a package 10 is shown to include a brass, disk-shaped base 12 having threads machined about its outer periphery to engage a circular, cup-shaped brass cover 14. The package 10 is used to enclose a plurality of, here four, electrically interconnected electrical interconnect boards 16a–16d and to enable electrical connection of such boards to circuitry (not shown) which is external to the package 10 by means of connector pins 18 which pass into such package 10 through glass-to-metal feedthroughs 20 and which protrude from the base 12 to enable insertion of such pins 18 into a suitable plug-in type receptacle (not shown). Such package 10 here has an outer diameter in the order of four inches and a height in the order of one inch.

Figure 3:
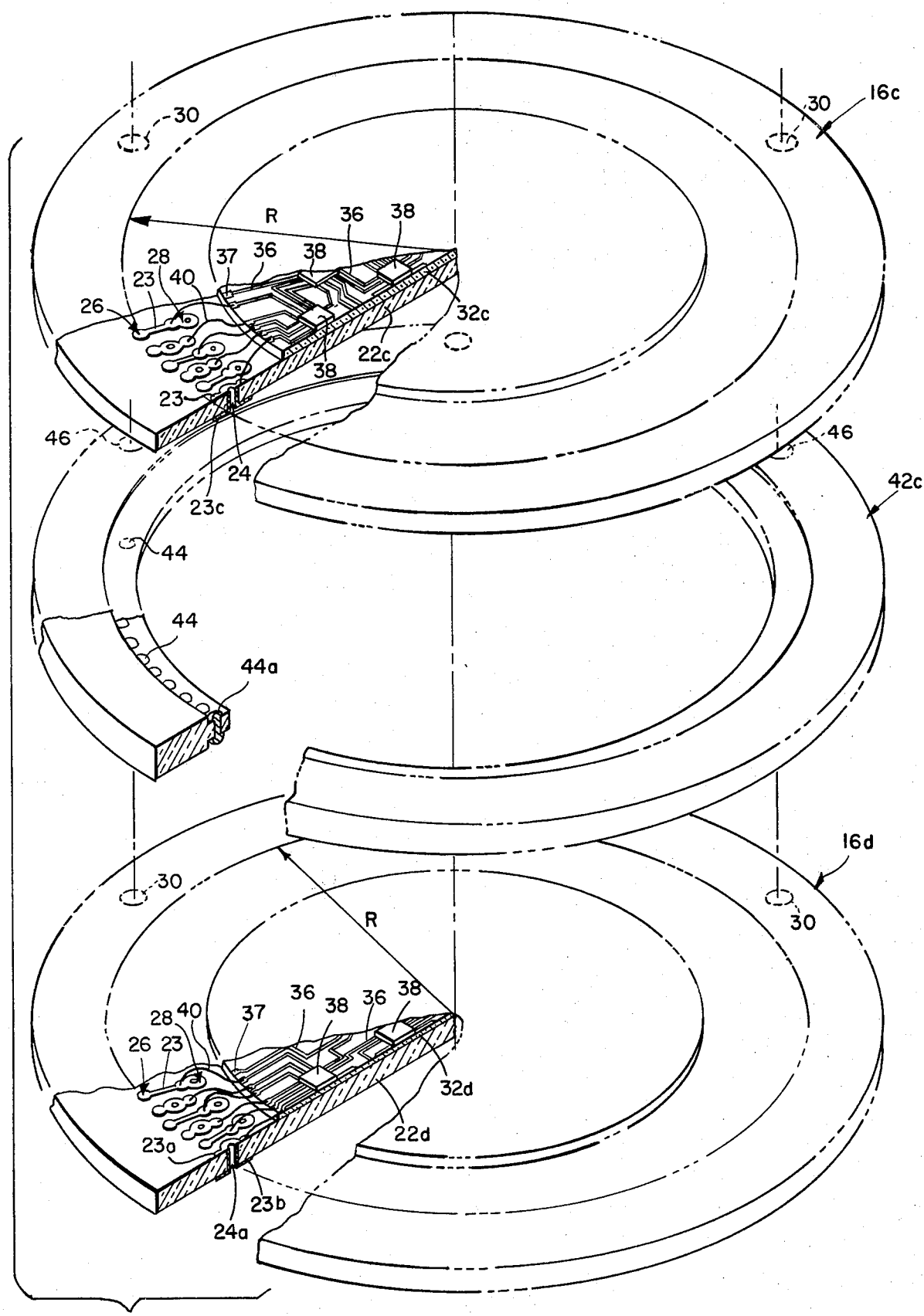
FIG. 3 is an exploded isometric view, partially broken away, showing a pair of dielectric support structures separated by a spacer and having patterns of conductors disposed thereon electrically interconnected by contact pins disposed in such spacer.

Referring now also to FIGS. 3 and 4, the electrical interconnection between an exemplary pair of the boards 16a–16d, here boards 16c, 16d, is shown (FIG. 3), and the electrical interconnection of such exemplary pair of boards 16c, 16d to pins 18 is also shown (FIG. 4). In particular, each one of the electrical interconnect boards 16a–16d includes a dielectric support structure 22a–22d, respectively. Here the dielectric support structures 22a–22d are disk-shaped, glass-ceramic boards, here Fotoceram material manufactured by Corning Glass Company, Corning, New York. A pattern of conductive contact pads 23, here gold plated copper, is formed on the upper and lower surfaces of the dielectric support structures 22a–22d adjacent the outer periphery thereof, here using conventional printed circuit photolithographic-chemical etching manufacture techniques. It is noted that each one of the contact pads 23 on the upper surfaces of the dielectric support structures 22a–22d has a matching contact pad 23 formed directly underneath it on the lower surfaces of the dielectric support structures 22a–22d. Having formed such contact pads 23, holes 24 are machined in each contact pad 23 formed on the upper surfaces which pass through the dielectric support structures 22a-22d into the corresponding contact pad 23 formed on the lower surfaces of the support structures 22a-22d as shown. The walls of such holes 24 are then plated with copper, in any conventional manner, to electrically interconnect the contact pads 23 formed on the upper surfaces of the dielectric support structures 22a-22d with corresponding ones of the contact pads 23 formed on the lower surfaces of such structures. For example, considering an exemplary one of the dielectric support structures 22a-22d, here dielectric support structure 22d, one of the contact pads 23 formed on the upper surface thereof, here the contact pad labelled 23a, is electrically connected to a corresponding one of the contact pads 23 formed on the lower surface, here the contact pad labelled 23b, because of the copper plated on the walls of the hole 24, here the hole labelled 24a drilled through the pads 23a, 23b. Each contact pad may be considered as having two regions: a contact region 26, and a terminal region 28 (FIGS. 3 and 4.) The contact regions 26 are disposed along a circle of radius R, here in the order of 1.75 inches. Next, holes 30 are machined or drilled through the dielectric structures 22a-22d as shown. Such holes 30 are disposed about a circle here of a radius in the order of 1.85 inches. Such holes 30 are used to enable insertion of mounting screws 34 through the dielectric support structures 22a-22d. As will be discussed hereinafter, the holes 30 are irregularly positioned, or spaced, about the circle to provide indexing of such support structures 22a-22d within the package 10, enabling such dielectric support structures 22a-22d to be positioned within the package 10 in one unique angular orientation for reasons to become apparent.

Each one of the dielectric support structures 22a-22d provides a mounting base for a corresponding one of a plurality of insulating substrates 32a-32d, here three-inch diameter, disk-shaped sapphire substrates as shown in FIGS. 1, 3 and 4. Each one of the substrates 32a-32d is disposed on the central portion of a corresponding one of the dielectric support structures 22a-22d, respectively, as shown, and is fastened to the upper surfaces thereof here by a suitable epoxy. Each one of the sapphire substrates 32a-32d has a pattern of conductors 36 formed on the upper surface thereof using any conventional process. A plurality of contact pads 37 is also formed integrally with the conductors, about the outer periphery of such substrates 32a-32d, so that end portions of such conductors 36 terminate into such contact pads 37 as shown in FIGS. 3 and 4. Integrated circuit devices or chips 38 are bonded to the conductors 36 in a conventional manner. After mounting the substrates 32a-32d to corresponding ones of the dielectric support structures 22a-22d, each contact pad 37 is electrically connected to the terminal region 28 of a corresponding one of the contact pads 23 by a conductor 40 as shown in FIGS. 3 and 4. Here such conductors 40 are thermocompression bonded or soldered to the contact pads 23, 37 (FIG. 4).

A plurality of, here four, spacers or interconnect rings 42a-42d are provided. Each spacer is in the order of $\frac{1}{8}$ inch thick. Each one of the interconnect rings 42a-42d is made of a dielectric material, here Fotoceram material, and has a plurality of electrically conductive pins 44 molded into such ring as shown. Pins 44 are here silver or gold loaded silicone material. Here such material is manufactured by Technical Wire Products, Inc., Crawford, New Jersey 07016. The pins 44 are disposed along the same radius R as the contact regions 26 of contact pads 23. Interconnect ring 42a is disposed between the upper surface of dielectric support structure 22b and the lower surface of dielectric support structure 22a as shown in FIG. 1. Interconnect ring 42b is disposed between the upper surface of dielectric support structure 22c and the lower surface of dielectric support structure 22b, as shown; interconnect ring 42c is disposed between the upper surface of dielectric support structure 22d and the lower surface of dielectric support structure 22c, as shown. Interconnect ring 42d is disposed between the bottom surface of dielectric support structure 22d and a disk-shaped dielectric interconnect board 50, as shown.

Holes 46 are drilled through the interconnect rings 42a-42d, as shown. When holes 46 and the holes 30 which are formed in dielectric support structures 22a-22d are aligned each contact pin 44 will have a top portion aligned with the contact region 26 of a unique one of the contact pads 23 formed on the bottom surface of the dielectric support structure disposed above such interconnect ring and such contact pin will have a bottom portion aligned with the contact portion 26 of a unique one of the contact pads 23 formed on the upper surface of the dielectric support structure disposed beneath such ring. This unique relationship between each contact pin and the contact pads disposed above and beneath such contact pin results from the indexing effect provided by having holes 30 and 46 spaced irregularly about a circle as described above. It follows then that, when the dielectric support structures 22a-22d are interleaved with the interconnect rings and fastened together by screwing bolts 48 onto screws 34, the patterns of conductors 36 disposed on the dielectric support structures 22a-22d are electrically interconnected by the pins 44 of the interconnect rings 42a-42c because the interconnect boards 46a-46d and interconnect rings 42a-42d are suitably compressed together.

Pins 44 of interconnect ring 42d are used to electrically interconnect the patterns of conductors 36 to pins 18 by dielectric interconnect board 50 (here also made of Fotoceram material) as shown in FIGS. 1 and 4. Such board 50 has a pattern of copper contact pads 52 formed thereon using any conventional process. Each contact pad 52 has two regions: A contact region 54 and a terminal region 56 (FIG. 5). The contact region 54 of the pads 52 is disposed along a circle of radius R; i.e., the same circle about which pins 44 are disposed and about which the contact regions 26 of contact pads 23 are disposed. Holes 51 are drilled in the board 50. Such holes are drilled so that, when they are aligned with the holes 30 formed in dielectric support structures 22a-22d and the holes 46 formed in interconnect rings 42a-42d, each pin 44 in ring 42d is aligned with the contact region 54 of a unique one of the contact pads 52. That is, for example, an exemplary one of the pins 44, here the pin labelled 44b, is aligned with the contact region 26 of pad 23b and the contact region 54 of pad 52, as shown in FIG. 4. When assembled, the patterns of conductors 36 are electrically interconnected together and to pins 18, enabling use with electrical circuitry external to the package 10.

Referring now again to FIG. 1, screws 34 have their heads affixed to a brass ring 58 which itself is welded to the inner bottom of the base 12. A dielectric ring 60 is inserted above the dielectric support structure 16a, as shown, thereby completing the package 10.

Having described a preferred embodiment of the invention, it is now evident that other embodiments incorporating these concepts may be used. It is felt, therefore, that this invention should not be restricted to the disclosed embodiment but rather should be limited only by the spirit and scope of the appended claims.

What is claimed is:

1. An electrical interconnect system comprising:
   (a) a pair of substrates, each one thereof having a pattern of conductors formed on first surfaces thereof with end portions of such conductors providing a plurality of contact pads on the first surfaces;
   (b) a plurality of integrated circuit chips bonded to the conductors formed on the first surfaces of the pair of substrates;
   (c) a pair of dielectric support structures each one having a corresponding plurality of contact pads disposed on first surfaces of such support structures, a first one of the pair of support structures having a corresponding plurality of contact pads formed on a second, opposite, surface of such structure, each one of the contact pads on the first surface of such first one of the dielectric support structures being electrically connected to a corresponding one of the contact pads on the second surface thereof, each one of the pair of substrates having a second surface bonded to the first surface of a corresponding one of the dielectric support structures;
   (d) a plurality of connectors, each one thereof electrically connected between one of the plurality of contact pads formed on the first surface of the pair of dielectric support structures and a corresponding one of the contact pads formed on the one of the pair of substrates bonded to the first surface of such dielectric support structure; and
   (e) a dielectric spacer having a plurality of electrical contact pins passing therethrough, such spacer being disposed between the pair of dielectric support structures, one end of each contact pin being electrically connected to a corresponding one of the contact pads formed on the second surface of the first one of the dielectric support structures and the other end of such contact pin being electrically connected to a corresponding one of the contact pads on the first surface of the second one of the support structures.

2. The interconnect system recited in claim 1 wherein the second one of the pair of dielectric support structures has a corresponding plurality of contact pads formed on a second, opposite, surface thereof, each one of the contact pads on the first surface being electrically connected to a corresponding one of the contact pads formed on the second surface, and including: an enclosure for the pair of support structures and the spacer; and, a plurality of connector pins passing through the enclosure, each end portion of such connector pins being electrically connected to a corresponding one of the contact pads formed on the second surface of the second dielectric support structure.

3. The electrical interconnect system recited in claim 1 wherein the contact pads formed on the pair of substrates are disposed about the periphery of such pair of substrates and the contact pads formed on the pair of dielectric support structures are formed about the periphery of the pair of dielectric support structures.

4. The electrical interconnect system recited in claim 1 wherein each one of the pair of substrates is a single crystal substrate.

5. The electrical interconnect system recited in claim 1 wherein each one of the pair of substrates is sapphire.

* * * * *